(12) United States Patent
Hayashi et al.

(10) Patent No.: US 10,415,150 B2
(45) Date of Patent: Sep. 17, 2019

(54) APPARATUS FOR MANUFACTURING SILICON SINGLE CRYSTAL AND MELT INLET PIPE OF THE SAME

(71) Applicant: SUMCO CORPORATION, Tokyo (JP)

(72) Inventors: Mitsuaki Hayashi, Tokyo (JP); Wataru Sugimura, Tokyo (JP); Ippei Shimozaki, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 15/677,368

(22) Filed: Aug. 15, 2017

(65) Prior Publication Data

US 2018/0066377 A1    Mar. 8, 2018

(30) Foreign Application Priority Data

Sep. 6, 2016  (JP) ................................. 2016-173700

(51) Int. Cl.
*C30B 15/02* (2006.01)
*C30B 35/00* (2006.01)
(Continued)

(52) U.S. Cl.
CPC ............. *C30B 15/02* (2013.01); *C30B 15/04* (2013.01); *C30B 15/10* (2013.01); *C30B 15/12* (2013.01);
(Continued)

(58) Field of Classification Search
CPC ......... C30B 15/02; C30B 29/06; C30B 15/04; C30B 15/10; C30B 15/002; C30B 15/12; C30B 35/00; Y10T 117/1056
See application file for complete search history.

(56) References Cited

U.S. PATENT DOCUMENTS 4,225,378 A * 9/1980 Garrison ................. C30B 15/02
117/212
6,361,597 B1 * 3/2002 Takase .................... C30B 15/02
117/18
(Continued)

FOREIGN PATENT DOCUMENTS

JP      01-148780         6/1989
JP      09227274 A  *    9/1997 ............. C30B 15/02
(Continued)

OTHER PUBLICATIONS

European Patent Office, English computer translation of JP09227274 (Year: 2018).*
(Continued)

*Primary Examiner* — Matthew J Song
(74) *Attorney, Agent, or Firm* — Greenblum & Bernstein, P.L.C.

(57) ABSTRACT

An apparatus for manufacturing a silicon single crystal is provided. The apparatus comprises a chamber (11), a quarts crucible (21) provided in the chamber so as to be rotatable and movable upward and downward and store a silicon melt, a first heater (25) for melting a silicon raw material stored in the crucible, and a pulling mechanism (32) provided in the chamber so as to be rotatable and movable upward and downward. The pulling mechanism has a lower end to which a seed crystal (S) is attached. The seed crystal is to be dipped in the silicon melt in the crucible and pulled upward for growing a silicon single crystal by a Czochralski method. The apparatus further comprises a melt supplying mechanism (50) for supplying an additional silicon melt to the silicon melt in the crucible from external of the chamber. The melt supplying mechanism includes a melt inlet pipe (51) disposed at an inclination angle θ1 of 50° to 80° with respect to the melt surface of the silicon melt and a melt generating mechanism (54) for supplying the additional
(Continued)

silicon melt (M) to an opening part (512) of a base end of the melt inlet pipe. The melt inlet pipe has a tip end provided with an opening part (511). The opening part of the tip end has an annular surface inclined at an angle θ2 with respect to a direction orthogonal to the axis of the melt inlet pipe. The annular surface has a vertically lower side (511*a*) and a vertically upper side (511*b*). The vertically lower side is located nearer to the tip end in the axis direction than the vertically upper side.

8 Claims, 8 Drawing Sheets

(51) Int. Cl.
    *C30B 15/04*     (2006.01)
    *C30B 15/12*     (2006.01)
    *C30B 15/10*     (2006.01)
    *C30B 29/06*     (2006.01)

(52) U.S. Cl.
    CPC .............. *C30B 29/06* (2013.01); *C30B 35/00* (2013.01); *Y10T 117/1056* (2015.01)

(56) References Cited

U.S. PATENT DOCUMENTS

| | | | | |
|---|---|---|---|---|
| 6,423,137 | B1* | 7/2002 | Takase | C30B 15/02 117/214 |
| 7,465,351 | B2* | 12/2008 | Holder | C30B 15/00 117/214 |
| 2005/0045093 | A1* | 3/2005 | Watanabe | C30B 15/02 117/200 |
| 2005/0092236 | A1* | 5/2005 | Bender | C30B 15/02 117/200 |
| 2011/0174214 | A1 | 7/2011 | Horioka | |
| 2012/0199221 | A1* | 8/2012 | Nakamura | C30B 29/06 137/561 A |
| 2012/0228081 | A1* | 9/2012 | Tadokoro | B65G 11/146 193/30 |
| 2012/0266808 | A1 | 10/2012 | Luter et al. | |
| 2013/0098290 | A1 | 4/2013 | Luter et al. | |
| 2015/0354088 | A1* | 12/2015 | Haringer | C30B 15/04 117/214 |
| 2016/0017513 | A1* | 1/2016 | Haringer | C30B 29/06 117/19 |
| 2016/0060787 | A1* | 3/2016 | Park | C30B 29/06 117/19 |
| 2018/0066377 | A1* | 3/2018 | Hayashi | C30B 15/02 |

FOREIGN PATENT DOCUMENTS

| | | |
|---|---|---|
| JP | 2000-264773 A | 9/2000 |
| JP | 2000-264774 | 9/2000 |
| JP | 2008-195601 | 8/2008 |
| JP | 2010-126377 | 6/2010 |
| JP | 2012-037167 | 2/2012 |
| JP | 2012-189243 | 10/2012 |
| JP | 2014-512330 | 5/2014 |

OTHER PUBLICATIONS

Japanese Office Action dated May 28, 2019 in Japanese Application No. 2016-173700, and corresponding English translation thereof.

\* cited by examiner

APPARATUS FOR MANUFACTURING SILICON SINGLE CRYSTAL AND MELT INLET PIPE OF THE SAME

BACKGROUND OF THE INVENTION

1. Technical Field of the Invention

The present invention relates to an apparatus for manufacturing a silicon single crystal and a melt inlet pipe of the same.

2. Description of the Related Art

A large amount of silicon raw material is necessary when, in particular, manufacturing a silicon single crystal of large diameter and length by a Czochralski method (CZ method). However, the capacity of a quartz crucible that is initially filled with silicon raw material chunks is limited, so the raw material exceeding the capacity may have to be added after being melted.

An apparatus of this kind for charging an additional silicon melt after melting silicon raw material chunks in a quartz crucible is known (JP2000-264773A). This apparatus includes communicating pipes that have a joint and are used for supplying the additional silicon melt from another crucible for additional supply to the quartz crucible. The communicating pipes are arranged such that an angle α between the center axis of the communicating pipes and a drawn surface of the joint portion is smaller than a setting angle β of the communicating pipes between the center axis of the communicating pipes and the horizontal plane.

In the above prior art, however, the charging speed of the melt is slow because the angle β (setting angle of the communicating pipes with respect to the horizontal plane) is a small angle of 30°. Thus, even when the angle α is set smaller than the angle β, blocking with the silicon melt may occur in the communicating pipes as a whole. On the other hand, a large angle of β may cause a splash of the melt in the crucible. These are therefore in a trade-off relationship.

A first object of the present invention is to provide an apparatus for manufacturing a silicon single crystal and a melt inlet pipe of the same with which the melt splash can be suppressed. A second object of the present invention is to provide an apparatus for manufacturing a silicon single crystal and a melt inlet pipe of the same with which the blocking with silicon melt can be suppressed.

SUMMARY OF THE INVENTION

According to an aspect of the present invention, the above first object is achieved by providing a melt inlet pipe used in an apparatus for manufacturing a silicon single crystal. The apparatus grows the silicon single crystal by a Czochralski method. The melt inlet pipe supplies an additional silicon melt to a silicon melt in a crucible from external of a chamber. The melt inlet pipe has a tip end provided with an opening part. The opening part has an annular surface inclined at an angle with respect to a direction orthogonal to the axis of the melt inlet pipe. The annular surface has a vertically lower side and a vertically upper side. The vertically lower side is located nearer to the tip end in the axis direction than the vertically upper side.

In this case, the melt inlet pipe is preferably disposed at an inclination angle $\theta 1$ of 45° to 60° with respect to the melt surface of the silicon melt. More specifically, the inclination angle $\theta 1$ of the melt inlet pipe is preferably set at 45° to 75° when the supplying amount of the additional silicon melt by the melt inlet pipe is 50 kg±10 kg, the inclination angle $\theta 1$ of the melt inlet pipe is preferably set at 45° to 80° when the supplying amount of the additional silicon melt by the melt inlet pipe is 100 kg±10 kg, and the inclination angle $\theta 1$ of the melt inlet pipe is preferably set at 45° to 60° when the supplying amount of the additional silicon melt by the melt inlet pipe is 150 kg±10 kg.

According to another aspect of the present invention, the above second object is achieved by providing a melt inlet pipe used in an apparatus for manufacturing a silicon single crystal. The apparatus grows the silicon single crystal by a Czochralski method. The melt inlet pipe supplies an additional silicon melt to a silicon melt in a crucible from external of a chamber. The melt inlet pipe is disposed at an inclination angle $\theta 1$ of 60° to 85° with respect to the melt surface of the silicon melt.

In this case, the melt inlet pipe preferably has a tip end provided with an opening part. The opening part may have an annular surface inclined at an angle with respect to a direction orthogonal to the axis of the melt inlet pipe. The annular surface may have a vertically lower side and a vertically upper side. The vertically lower side may be located nearer to the tip end in the axis direction than the vertically upper side.

More specifically with regard to the inclination angle $\theta 1$ in this case, the inclination angle $\theta 1$ of the melt inlet pipe is preferably set at 60° to 85° when the supplying amount of the additional silicon melt by the melt inlet pipe is 50 kg±10 kg, the inclination angle $\theta 1$ of the melt inlet pipe is preferably set at 50° to 85° when the supplying amount of the additional silicon melt by the melt inlet pipe is 100 kg±10 kg, and the inclination angle $\theta 1$ of the melt inlet pipe is preferably set at 50° to 85° when the supplying amount of the additional silicon melt by the melt inlet pipe is 150 kg±10 kg.

According to still another aspect of the present invention, the above first and second objects are achieved by providing an apparatus for manufacturing a silicon single crystal. The apparatus comprises a chamber, a crucible provided in the chamber so as to be rotatable and movable upward and downward and store a silicon melt, a first heater for melting a silicon raw material stored in the crucible, and a pulling mechanism provided in the chamber so as to be rotatable and movable upward and downward. The pulling mechanism has a lower end to which a seed crystal is attached. The seed crystal is to be dipped in the silicon melt in the crucible and pulled upward for growing a silicon single crystal by a Czochralski method. The apparatus further comprises a melt supplying mechanism for supplying an additional silicon melt to the silicon melt in the crucible from external of the chamber. The melt supplying mechanism includes a melt inlet pipe disposed at an inclination angle $\theta 1$ of 50° to 80° with respect to the melt surface of the silicon melt and a melt generating mechanism for supplying the additional silicon melt to an opening part of a base end of the melt inlet pipe. The melt inlet pipe has a tip end provided with an opening part. The opening part of the tip end has an annular surface inclined at an angle with respect to a direction orthogonal to the axis of the melt inlet pipe. The annular surface has a vertically lower side and a vertically upper side. The vertically lower side is located nearer to the tip end in the axis direction than the vertically upper side.

More specifically with regard to the inclination angle $\theta 1$ in this case, the inclination angle $\theta 1$ of the melt inlet pipe is preferably set at 60° to 75° when the supplying amount of the additional silicon melt by the melt inlet pipe is 50 kg±10 kg, the inclination angle θ1 of the melt inlet pipe is preferably set at 50° to 80° when the supplying amount of the additional silicon melt by the melt inlet pipe is 100 kg±10 kg, and the inclination angle θ1 of the melt inlet pipe is preferably set at 50° to 60° when the supplying amount of the additional silicon melt by the melt inlet pipe is 150 kg±10 kg.

According to the present invention, the tip end of the melt inlet pipe is configured to include an upward opening part obtained by obliquely cutting the melt inlet pipe at the tip end with respect to the axis and, therefore, the gas expanding in the melt inlet pipe due to flow of the silicon melt escapes sideward from the opening part and is less likely to collide with the melt surface in the crucible. This can suppress the melt splash. Moreover, the charge speed of silicon melt can be high enough to suppress the blocking with the silicon melt because the inclination angle of the melt inlet pipe is set at any angle within a range of 50° to 85° in accordance with the supplying amount of the silicon melt.

DESCRIPTION OF THE PREFERRED EMBODIMENT

Figure 1:
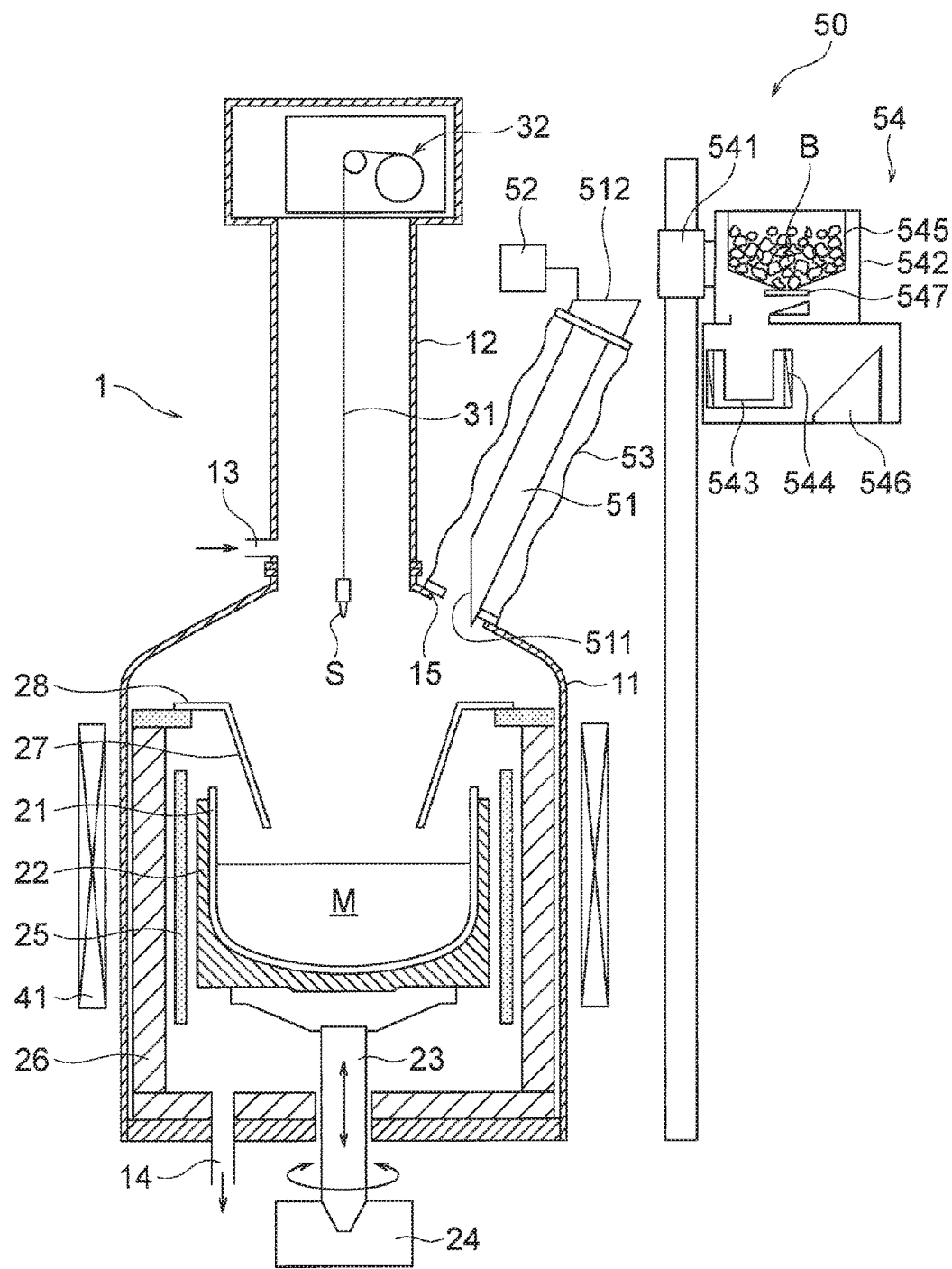
FIG. 1 is a cross-sectional view illustrating an embodiment of the apparatus for manufacturing a silicon single crystal according to the present invention.

Hereinafter, an embodiment of the present invention will be described with reference to the drawings. FIG. 1 is a cross-sectional view illustrating an embodiment of an apparatus 1 for manufacturing a silicon single crystal according to the present invention (also simply referred to as a "manufacturing apparatus 1," hereinafter). Although not particularly limited, the manufacturing apparatus 1 of the present embodiment is an apparatus that may preferably be used when requiring supplement (additional charge) of a raw material in the initial stage of manufacturing in a case of manufacturing one silicon single crystal ingot and/or when requiring supply (recharge) of a raw material in a case of manufacturing a silicon single crystal and then subsequently manufacturing another silicon single crystal. For example, when one silicon ingot is manufactured, a quartz crucible 21 is charged with silicon raw material chucks without spaces as much as possible and the chucks are melted by a heater, but the melt surface of the melt will lower as the spaces exist. The additional charge may therefore be performed to a predetermined melt surface to manufacture an ingot having a long length to a maximum extent, thus increasing the productivity. The productivity can also be increased by sequentially pulling a plurality of ingots because in this case it is possible to reduce the time required for the operation of putting the silicon raw material and the time required for melting.

To this end, the manufacturing apparatus 1 for a silicon single crystal according to the present embodiment includes a melt supplying mechanism 50 in addition to the basic configuration of the manufacturing apparatus 1, which mainly comprises a first chamber 11, a second chamber 12, a quartz crucible 21 that is provided in the first chamber 11 so as to be rotatable and movable upward and downward and stores a silicon raw material, a first heater 25 that melts the silicon raw material stored in the quartz crucible 21, and a pulling mechanism 32 that has a lower end to which a seed crystal S is attached. The pulling mechanism 32 is provided partially in the first chamber 11 and the second chamber 12 so as to be rotatable and movable upward and downward. The melt supplying mechanism 50 is configured to supply an additional melt of the silicon raw material to a melt M in the quartz crucible 21 from external of the first chamber 11.

The configuration other than the melt supplying mechanism 50 will be described first. The manufacturing apparatus 1 of the present embodiment includes the first chamber 11, which is formed in a cylindrical shape, and the second chamber 12, which is also formed in a cylindrical shape. The first and second chambers 11 and 12 are connected to each other in an airtight manner. The quartz crucible 21 for storing the silicon melt M and a graphite crucible 22 for protecting the quartz crucible 21 are supported in the first chamber 11 by a support shaft 23 and allowed to rotate and move upward and downward by a drive mechanism 24. In addition, the first heater 25 in a circular shape and a thermal insulation barrel 26 that is also in a circular shape and formed of a thermal insulant are arranged so as to surround the quartz crucible 21 and the graphite crucible 22. The radiated heat from the first heater 25 in a circular shape transmits not only to the side part but also to the bottom part of the graphite crucible 22 to heat the side part and bottom part of the quartz crucible 21. Another first heater may be added below the quartz crucible 21.

A thermal shield member 27 in a circular truncated cone-like shape is provided inside the first chamber 11 and above the quartz crucible 21. The thermal shield member 27 may be formed of a material obtained by filling inside of an outer shell, which is made of a refractory metal, such as molybdenum and tungsten, carbon, or graphite, with a carbon thermal insulant. The thermal shield member 27 serves to shut off the radiation from the silicon melt M to a silicon single crystal C and regulate the gas flowing in the first chamber 11. The thermal shield member 27 is fixed to the thermal insulation barrel 22 using a bracket 28. In an embodiment, the lower end of the thermal shield member 27 may be provided with a thermal barrier part to face the entire surface of the silicon melt M. This can cut the radiation from the surface of the silicon melt M and promote heat retention at the surface of the silicon melt M.

The second chamber 12 connected to the upper part of the first chamber 11 is a chamber that houses a grown silicon single crystal C. The silicon single crystal C can be taken out through the second chamber 12. The upper part of the second chamber 12 is provided with the pulling mechanism 32 which pulls up the silicon single crystal while rotating it with a wire 31. The seed crystal S is attached to a chuck at the lower end of the wire 31 which is vertically suspended from the pulling mechanism 32. An inert gas such as argon gas is introduced into the first chamber 11 from a gas intake port 13 provided at the upper part of the first chamber 11. The inert gas passes through a space between the silicon single crystal C being pulled upward and the thermal shield member 27, then passes through a space between the lower end of the thermal shield member 27 and the melt surface of the silicon melt M, further rises up to the upper end of the quartz crucible 21, and is finally exhausted from a gas exhaust port 14.

A magnetic field generating device 41 is disposed outside the first chamber 11 (formed of a non-magnetic shield material) so as to surround the first chamber 11. The magnetic field generating device 41 serves to apply a magnetic field to the melt M in the quartz crucible 21. The magnetic field generating device 41, which generates a horizontal magnetic field toward the quartz crucible 21, is configured to include one or more magnetic coils. The magnetic field generating device 41 can control the thermal convection of the melt M in the quartz crucible 21 thereby to allow the impurity distribution to be uniform in a wafer. This effect is significant in particular when manufacturing a silicon single crystal having a large diameter. In addition or alternatively, a magnetic field generating device for generating a cusped magnetic field or vertical magnetic field may be used. In an embodiment, the magnetic field generating device 41 may be omitted as necessary.

When the manufacturing apparatus 1 of the present embodiment is used to grow a silicon single crystal by the CZ method, the silicon melt M is first prepared through filling the quartz crucible 21 with silicon raw material chunks of polycrystalline silicon, which may be doped with a dopant if necessary, and operating the first heater 25 to melt the silicon raw material in the quartz crucible 21. During this operation, if the silicon melt M does not reach the maximum capacity of the quartz crucible 21, the melt supplying mechanism 50 can be used for the additional charge of an additional silicon melt.

As illustrated in FIG. 1, the melt supplying mechanism 50 of the present embodiment includes a melt inlet pipe 51 made of quartz and a melt generating mechanism 54.

Figure 5:
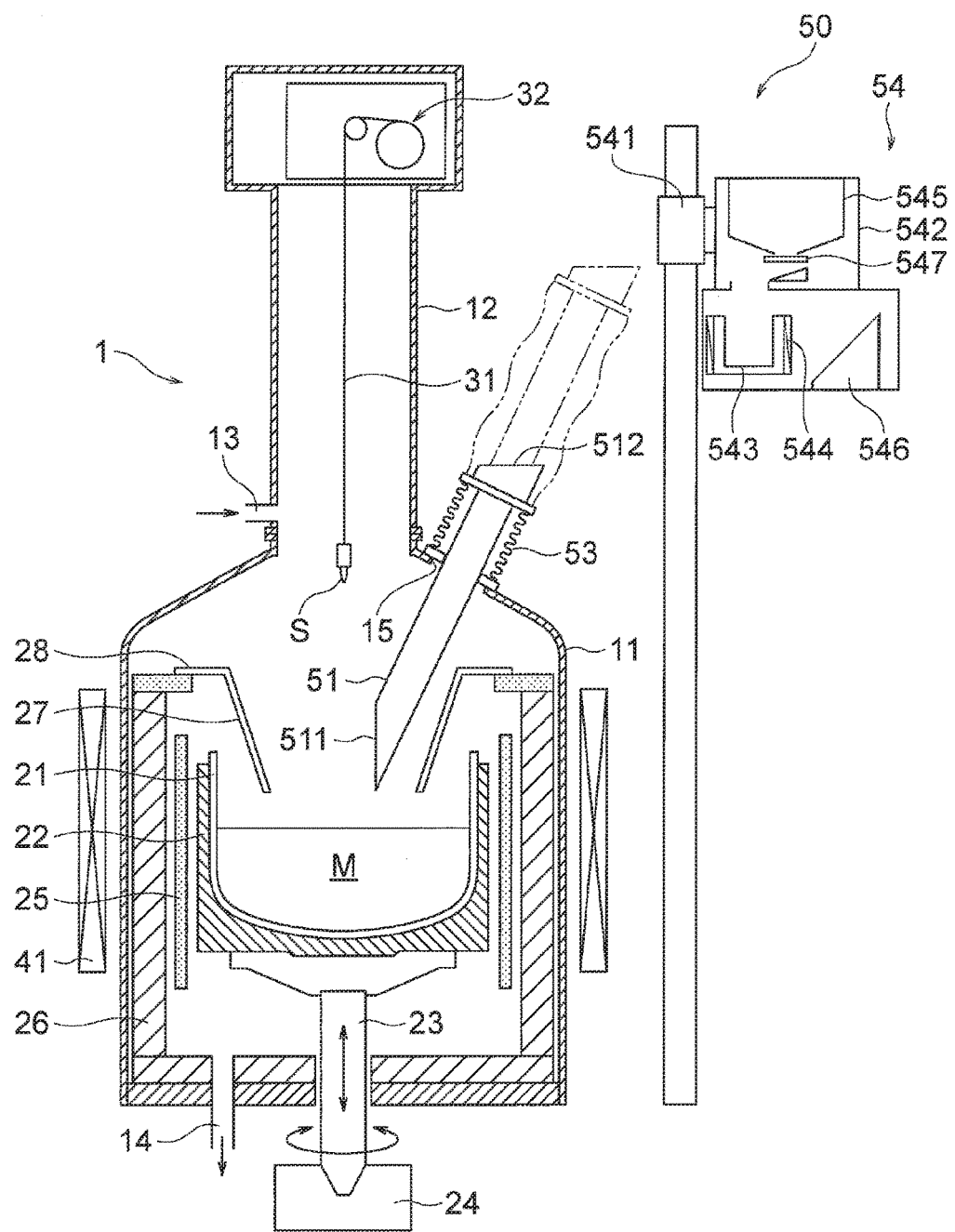
FIG. 5 is a cross-sectional view illustrating a third step of performing the additional charge of silicon melt.

The melt inlet pipe 51 is configured to be movable between a backward position as illustrated in FIG. 1 and a forward position as illustrated by solid lines in FIG. 5 while being supported by a moving mechanism 52 so that the melt inlet pipe 51 is disposed in a through hole 15 opened at a sidewall of the first chamber 11. The melt inlet pipe 51 is surrounded by a stretchable bellows 53. One end of the bellows 53 is provided at the through hole 15 of the first chamber 11 in an airtight manner and the other end of the bellows 53 is provided at a base end of the melt inlet pipe 51 also in an airtight manner. This allows the melt inlet pipe 51 to move forward and backward between the backward position illustrated in FIG. 1 and the forward position illustrated as solid lines in FIG. 5 by the moving mechanism 52 while being surrounded by the bellows 53. Although not illustrated, a valve for airtight close is provided at an opening part 512 of the base end of the melt inlet pipe 51.

Figure 2A:
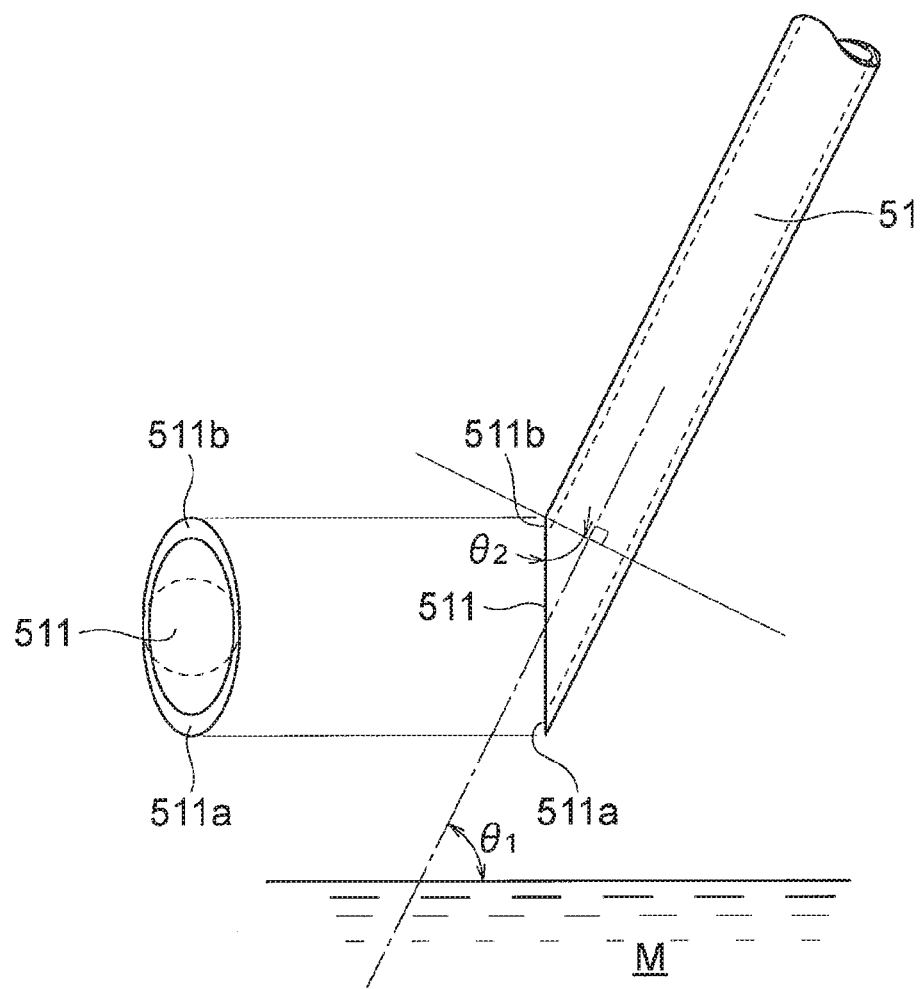
FIG. 2A is a set of side elevational view and front elevational view illustrating a tip end part of the melt inlet pipe of FIG. 1.

As illustrated in FIG. 2A, the melt inlet pipe 51 of the present embodiment is disposed at an inclination angle θ1 of 50° to 80° with respect to the melt surface of the melt M in the quartz crucible 21. The inclination angle θ1 in this case refers to an acute angle formed between the axis of the melt inlet pipe 51 and the melt surface of the melt M (i.e. the horizontal plane). If the inclination angle θ1 of the melt inlet pipe 51 is smaller than 50°, the charge speed of the raw material melt supplied from the melt inlet pipe 51 will be small and the blocking with the raw material melt cannot be sufficiently suppressed, which may not be preferred. In addition, a small charge speed may disadvantageously cause a long time for the charge. On the other hand, if the inclination angle θ1 of the melt inlet pipe 51 is larger than 80°, the charge speed of the raw material melt supplied from the melt inlet pipe 51 will be unduly large and the melt splash occurring at the melt surface in the quartz crucible 21 cannot be sufficiently suppressed, which may not be preferred.

As illustrated in FIG. 2A, the melt inlet pipe 51 of the present embodiment has a tip end provided with an opening part 511. The opening part 511 has an annular surface inclined at an angle θ2 (0°<θ2<90°) with respect to a direction orthogonal to the axis of the melt inlet pipe 51. The annular surface has a vertically lower side 511a and a vertically upper side 511b. The vertically lower side 511a is located nearer to the tip end in the axis direction than the vertically upper side 511b. In other words, the opening part 511 of the tip end of the melt inlet pipe 51 is made as an upward opening part obtained by cutting the melt inlet pipe 51 obliquely to the axis. This will be more specifically described with reference to a comparative example of a melt inlet pipe 51 illustrated in FIG. 2B. The melt inlet pipe 51 of FIG. 2B has a downward opening part 511 obtained by cutting the melt inlet pipe 51 obliquely at an inclination angle θ3 with respect to a direction orthogonal to the axis. This structure is distinctly different from that in the present embodiment. That is, the vertically lower side 511a of the annular surface in the present embodiment is not located nearer to the rear end of the annular surface in the axis direction than the vertically upper side 511b. Rather, the vertically lower side 511a in the present embodiment is located nearer to the tip end in the axis direction than the vertically upper side 511b. The angle θ2 satisfies 0°<θ2<90°, but a larger angle θ2 is preferred because if it is unduly small, the effect of suppressing melt splash is small.

The specific structure of the moving mechanism 52 is not particularly limited. It suffices that the moving mechanism 52 is a mechanism that can move the melt inlet pipe 51 between the forward position (see FIG. 5), at which the tip end of the melt inlet pipe 51 is close to the melt surface of the melt M in the quartz crucible 21, and the backward position (see FIG. 1), at which the melt inlet pipe 51 is located outside the first chamber 11, while supporting the melt inlet pipe 51 surrounded by the bellows 53.

Figure 3:
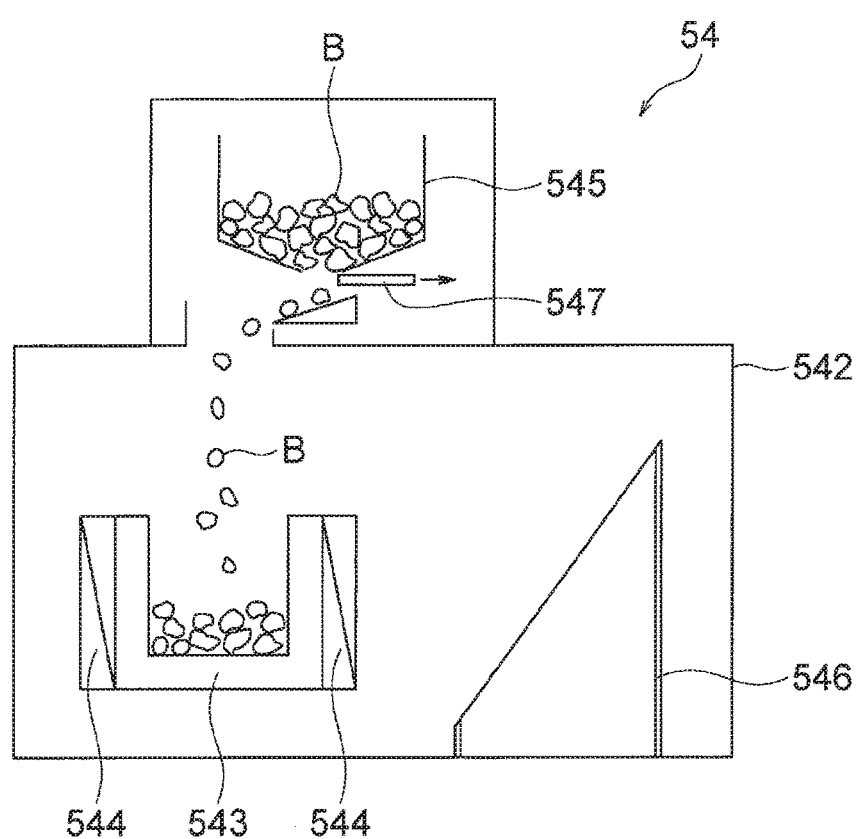
FIG. 3 is a cross-sectional view illustrating a first step of performing an additional charge of silicon melt.
Figure 4:
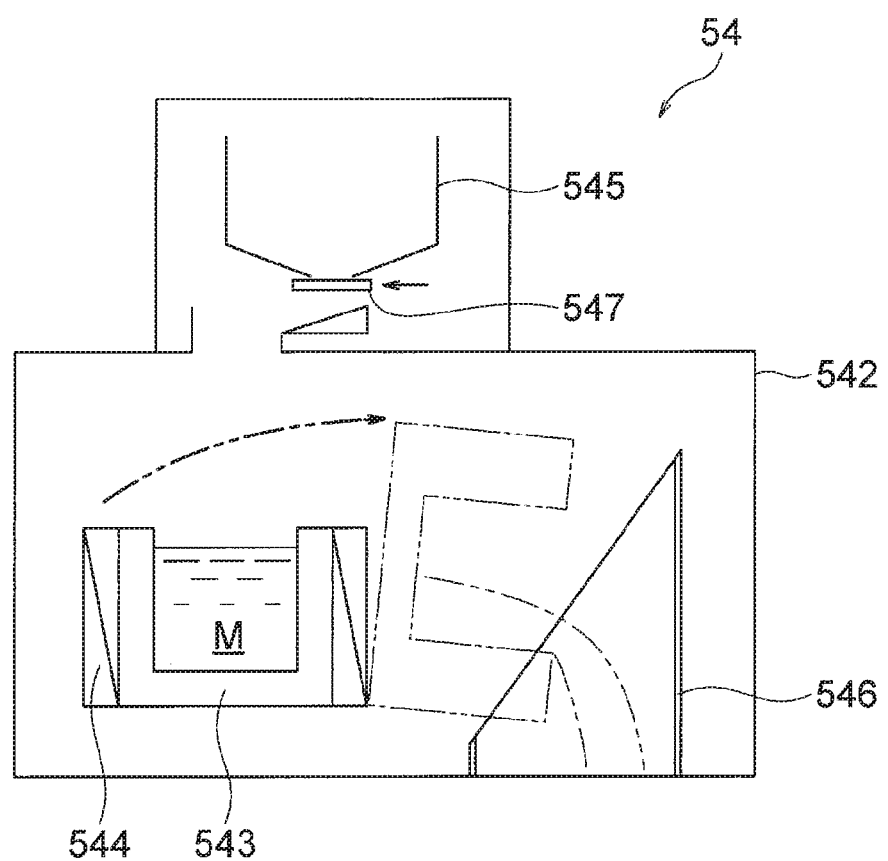
FIG. 4 is a cross-sectional view illustrating a second step of performing the additional charge of silicon melt.

As illustrated in FIG. 1, the melt generating mechanism 54 of the present embodiment includes a subchamber 542 that is provided so as to be movable upward and downward by an elevating mechanism 541. As illustrated in FIGS. 3 and 4, the subchamber 542 houses a quartz container 543 that is provided so as to be rotatable in a tilting manner in the subchamber 542, a second heater 544 that melts additional silicon raw material chunks B put in the container 543, a raw material hopper 545 that supplies the additional silicon raw material chunks B to the container 543, and an inlet port 546 that guides an additional melt M melted in the container 543 into the melt inlet pipe 51.

Figure 6:
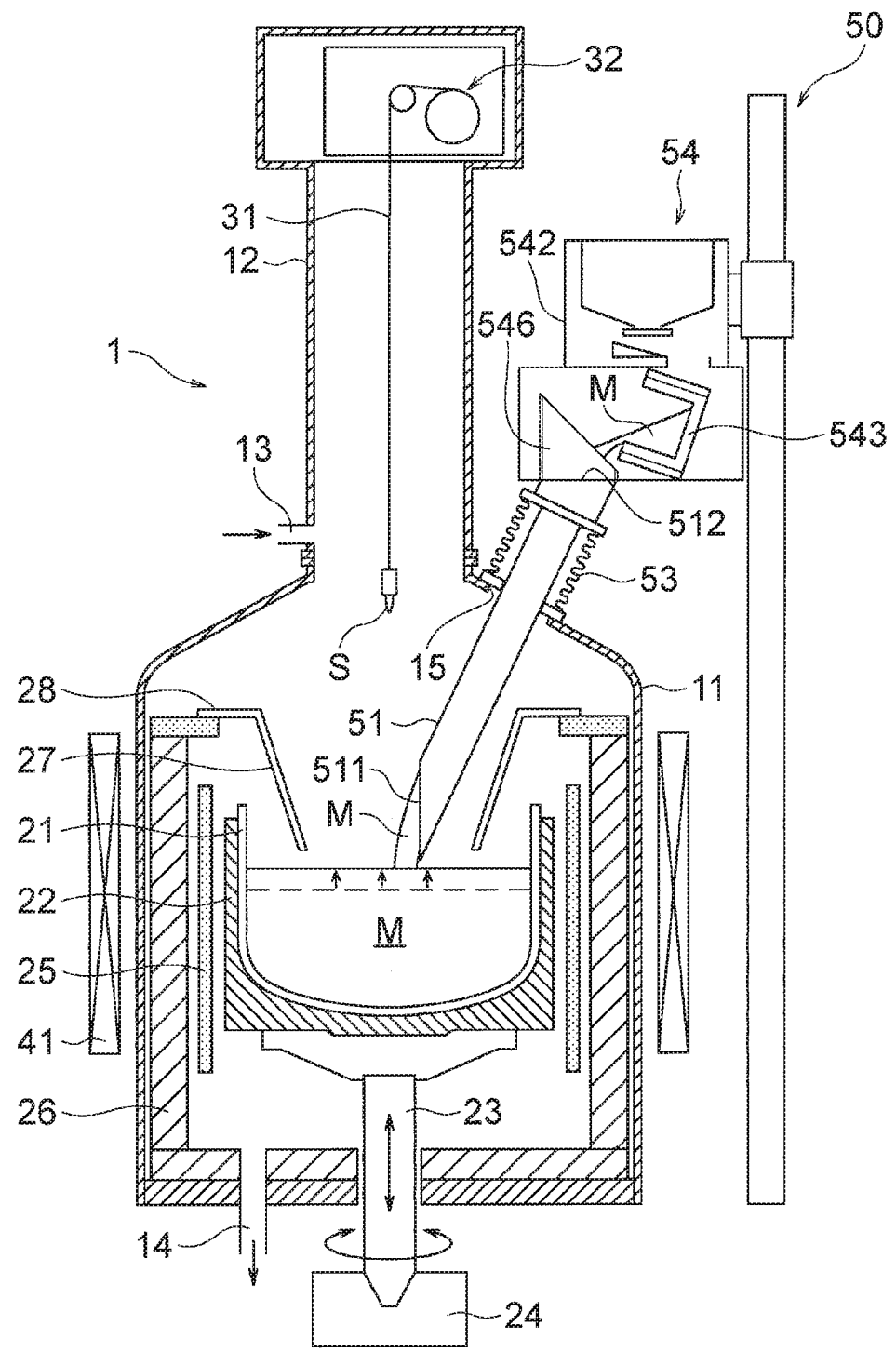
FIG. 6 is a cross-sectional view illustrating a fourth step of performing the additional charge of silicon melt.

The melt generating mechanism 54 can be used as follows. As illustrated in FIG. 3, the additional silicon raw material chunks B are put into the raw material hopper 545 and a valve 547 provided at the lower part of the raw material hopper 545 is opened to allow the silicon raw material chunks to drop into the container 543. After a certain amount of the silicon raw material chunks B is put into the container 543, the second heater 544 is operated to melt the silicon raw material chunks B, as illustrated in FIG. 4. Then, the melt inlet pipe 51 is moved to the forward position by the moving mechanism 52, as illustrated in FIG. 5, and thereafter the subchamber 542 is rotated, as illustrated in FIG. 6, to allow the inlet port 546 to dock with the opening part 512 of the base end of the melt inlet pipe 51. In this state, the container 543 is rotated to tilt, as illustrated by dashed-two dotted line in FIG. 4, using a rotating-to-tilt mechanism (not illustrated) so that the additional melt M in the container 543 is supplied to the opening part 512 of the base end of the melt inlet pipe 51 via the inlet port 546. Through this operation, the additional melt M in the container 543 is additionally charged into the quartz crucible 21 via the melt inlet pipe 51 to increase the volume of melt M in the quartz crucible 21.

Figure 7:
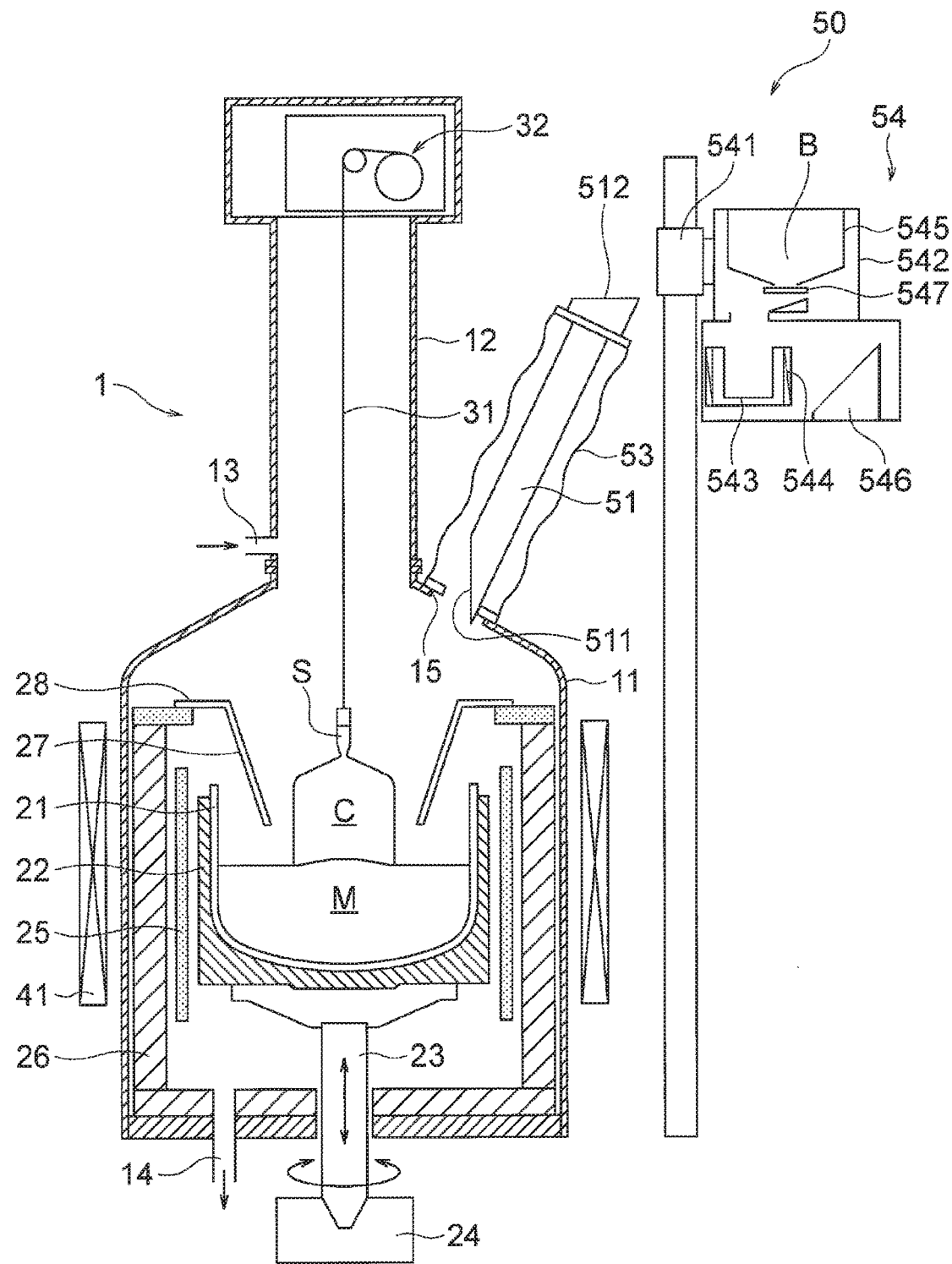
FIG. 7 is a cross-sectional view illustrating a state in which the pulling of a silicon single crystal is started after the additional charge of FIGS. 3 to 6 is completed.

After completion of the additional charge into the quartz crucible 21, the subchamber 542 is rotated to return to the original position, as illustrated in FIG. 7, the melt inlet pipe 51 is then moved to the backward position by the moving mechanism 52, and the opening part 512 of the base end is closed. Subsequently, the temperature of the silicon melt M is adjusted to be a pulling start temperature while the magnetic field generating device 41 is operated to start applying a horizontal magnetic field to the quartz crucible 21. After the temperature of the silicon melt M and the strength of magnetic field are stabilized, the quartz crucible 21 is rotated at a predetermined speed by the drive mechanism 24 while the inert gas is introduced from the gas intake port 13 and exhausted via the gas exhaust port 14, and the seed crystal S attached to the wire 31 is dipped in the silicon melt M. Then, as illustrated in FIG. 7, the wire 31 is slowly pulled upward while being rotated to form a neck part of silicon single crystal and the diameter thereof is then increased to a desired diameter. The silicon single crystal C is thus grown to have a straight body part having an approximately cylindrical shape.

The manufacturing apparatus 1 for a silicon single crystal of the present embodiment as illustrated in FIG. 1 was used for visual confirmation of the occurrence of melt splash at the melt surface in the quartz crucible 21 and confirmation of presence or absence of the blocking of the melt inlet pipe 51 or the attaching of the melt under the conditions, set as listed in Table 1 below, of the amount (kg) of additional charge of the silicon raw material chunks B, the inclination angle θ1 (°) of the melt inlet pipe 51, and presence or absence of the inclination angle θ2 (°) of the opening part 511 of the tip end of the melt inlet pipe 51. The quartz crucible 21 used has a maximum capacity of 480 kg and the melt inlet pipe 51 used is a quartz pipe having an inner diameter of 60 mm. The presence or absence of the inclination angle θ2 of the opening part 511 of the tip end of the melt inlet pipe 51 is listed as "Absent" when θ2=0° and "Present" when 0°<θ2<90°. When the inclination angle θ2 of the opening part 511 of the tip end of the melt inlet pipe 51 was "Absent," the position of the opening part 511 of the tip end was set so that the vertically lower side 511a of the opening part 511 would be located at the same position as that in the case of the inclination angle θ2 being "Present" (i.e., the vertically upper side 511b of FIG. 2A would be located at the tip end).

TABLE 1

| Sample No. | Amount of additional charge | Inclination angle θ1 | Presence or absence of θ2 | Occurrence of melt splash | Presence or absence of blocking or attaching |
|---|---|---|---|---|---|
| 1 | 50 kg | 45° | Present | None | Present |
| 2 | | | Absent | Small splash | Present |
| 3 | | 50° | Present | None | Present |
| 4 | | | Absent | Small splash | Present |

TABLE 1-continued

| Sample No. | Amount of additional charge | Inclination angle θ1 | Presence or absence of θ2 | Occurrence of melt splash | Presence or absence of blocking or attaching |
|---|---|---|---|---|---|
| 5 | | 55° | Present | None | Present |
| 6 | | | Absent | Small splash | Present |
| 7 | | 60° | Present | None | Absent |
| 8 | | | Absent | Small splash | Absent |
| 9 | | 65° | Present | None | Absent |
| 10 | | | Absent | Small splash | Absent |
| 11 | | 70° | Present | None | Absent |
| 12 | | | Absent | Large splash | Absent |
| 13 | | 75° | Present | None | Absent |
| 14 | | | Absent | Large splash | Absent |
| 15 | | 80° | Present | Small splash | Absent |
| 16 | | | Absent | Large splash | Absent |
| 17 | | 85° | Present | Small splash | Absent |
| 18 | | | Absent | Large splash | Absent |
| 21 | 100 kg | 45° | Present | None | Present |
| 22 | | | Absent | Small splash | Present |
| 23 | | 50° | Present | None | Absent |
| 24 | | | Absent | Small splash | Absent |
| 25 | | 55° | Present | None | Absent |
| 26 | | | Absent | Small splash | Absent |
| 27 | | 60° | Present | None | Absent |
| 28 | | | Absent | Small splash | Absent |
| 29 | | 65° | Present | None | Absent |
| 30 | | | Absent | Small splash | Absent |
| 31 | | 70° | Present | None | Absent |
| 32 | | | Absent | Large splash | Absent |
| 33 | | 75° | Present | None | Absent |
| 34 | | | Absent | Large splash | Absent |
| 35 | | 80° | Present | None | Absent |
| 36 | | | Absent | Large splash | Absent |
| 37 | | 85° | Present | Small splash | Absent |
| 38 | | | Absent | Large splash | Absent |
| 41 | 150 kg | 45° | Present | None | Present |
| 42 | | | Absent | Small splash | Present |
| 43 | | 50° | Present | None | Absent |
| 44 | | | Absent | Small splash | Absent |
| 45 | | 55° | Present | None | Absent |
| 46 | | | Absent | Small splash | Absent |
| 47 | | 60° | Present | None | Absent |
| 48 | | | Absent | Small splash | Absent |
| 49 | | 65° | Present | Small splash | Absent |
| 50 | | | Absent | Small splash | Absent |
| 51 | | 70° | Present | Small splash | Absent |
| 52 | | | Absent | Large splash | Absent |
| 53 | | 75° | Present | Small splash | Absent |
| 54 | | | Absent | Large splash | Absent |
| 55 | | 80° | Present | Small splash | Absent |
| 56 | | | Absent | Large splash | Absent |
| 57 | | 85° | Present | Small splash | Absent |
| 58 | | | Absent | Large splash | Absent |

«Consideration»

(1) With regard to samples in which the inclination angle θ2 of the opening part 511 of the tip end of the melt inlet pipe 51 was "Present," the melt splash did not occur in almost all the samples and only a small melt splash was rarely observed. In particular, with regard to samples in which the inclination angle θ1 of the melt inlet pipe 51 was 45° to 60°, the melt splash was not observed regardless of the amount of additional charge. Moreover, the melt splash was not observed in the samples in which the inclination angle θ1 of the melt inlet pipe 51 was 45° to 75° when the amount of additional charge was 50 kg, the samples in which the inclination angle θ1 of the melt inlet pipe 51 was 45° to 80° when the amount of additional charge was 100 kg, and the samples in which the inclination angle θ1 of the melt inlet pipe 51 was 45° to 60° when the amount of additional charge was 150 kg.

Figure 2B:
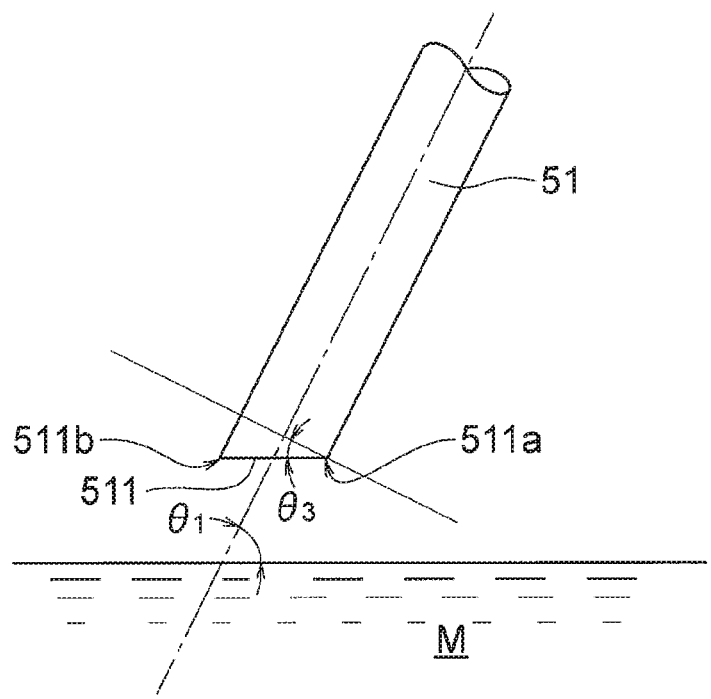
FIG. 2B is a side elevational view illustrating a comparative example for FIG. 2A.

It is thus inferable that, when additionally charging the silicon melt, the gas in the melt inlet pipe 51 expands due to heat every time the silicon melt flows, but as in the present embodiment, the tip end of the melt inlet pipe 51 is configured to include the upward opening part 511 obtained by obliquely cutting the melt inlet pipe 51 at the angle θ2 with respect to the direction orthogonal to the axis and the expanding pressure of gas can thereby be escaped just beside the opening part 511, which may lead to prevention of the melt splash. In contrast, in the case of the shape of opening part 511 as illustrated in FIG. 2B, it is inferable that the expanding gas in the melt inlet pipe 51 blows out directly toward the melt surface to increase the melt splash.

(2) With regard to samples in which the inclination angle θ1 of the melt inlet pipe 51 was 60° to 85°, the blocking of the melt inlet pipe 51 or the attaching of the melt was not observed. Moreover, the blocking of the melt inlet pipe 51 or the attaching of the melt was not observed in the samples in which the inclination angle θ1 of the melt inlet pipe 51 was 60° to 85° when the amount of additional charge was 50 kg, the samples in which the inclination angle θ1 of the melt inlet pipe 51 was 50° to 85° when the amount of additional charge was 100 kg, and the samples in which the inclination angle θ1 of the melt inlet pipe 51 was 50° to 85° when the amount of additional charge was 150 kg.

(3) When the amount of additional charge was 50 kg (Sample Nos. 1 to 18), the melt splash was not observed and the blocking of the melt inlet pipe 51 or the attaching of the melt was not observed in the samples under the conditions of Sample Nos. 7, 9, 11, and 13, that is, under the conditions that the inclination angle θ1 of the melt inlet pipe 51 was 60° to 75° and the inclination angle θ2 of the opening part 511 of the tip end of the melt inlet pipe 51 was "Present." When the amount of additional charge was 100 kg (Sample Nos. 21 to 38), the melt splash was not observed and the blocking of the melt inlet pipe 51 or the attaching of the melt was not observed in the samples under the conditions of Sample Nos. 23, 25, 27, 29, 31, 33, and 35, that is, under the conditions that the inclination angle θ1 of the melt inlet pipe 51 was 50° to 80° and the inclination angle θ2 of the opening part 511 of the tip end of the melt inlet pipe 51 was "Present." When the amount of additional charge was 150 kg (Sample Nos. 41 to 58), the melt splash was not observed and the blocking of the melt inlet pipe 51 or the attaching of the melt was not observed in the samples under the conditions of Sample Nos. 43, 45, and 47, that is, under the conditions that the inclination angle θ1 of the melt inlet pipe 51 was 50° to 60° and the inclination angle θ2 of the opening part 511 of the tip end of the melt inlet pipe 51 was "Present."

As described above, according to the manufacturing apparatus 1 for a silicon single crystal of the present embodiment, the tip end of the melt inlet pipe 51 is configured to include the upward opening part 511 obtained by obliquely cutting the melt inlet pipe 51 at the tip end with respect to the axis and, therefore, the gas expanding in the melt inlet pipe 51 due to flow of the silicon melt escapes sideward from the opening part 511 and is less likely to collide with the melt surface in the quartz crucible 21. This can suppress the melt splash. Moreover, the charge speed of silicon melt can be high enough to suppress the blocking with the silicon melt because the inclination angle θ1 of the melt inlet pipe 51 is set at any angle within a range of 50° to 85° in accordance with the supplying amount of the silicon melt.

Although not particularly limited, in an example, for the quartz crucible 21 having a maximum capacity of 480 kg±10 kg for the silicon melt, the inclination angle θ1 of the melt inlet pipe 51 is preferably set at 60° to 75° when the supplying amount of the additional silicon melt by the melt inlet pipe 51 is 50 kg±10 kg, the inclination angle θ1 of the melt inlet pipe 51 is preferably set at 50° to 80° when the supplying amount of the additional silicon melt by the melt inlet pipe 51 is 100 kg±10 kg, and the inclination angle θ1 of the melt inlet pipe 51 is preferably set at 50° to 60° when the supplying amount of the additional silicon melt by the melt inlet pipe 51 is 150 kg±10 kg. This can concurrently suppress both the melt splash and the blocking with silicon melt. In this case, when the supplying amount of the additional silicon melt by the melt inlet pipe 51 is within other ranges than the ranges of 50 kg±10 kg, 100 kg±10 kg, and 150 kg±10 kg, that is, when the supplying amount is within a range of 60 to 90 kg or 110 to 140 kg, the inclination angle θ1 of the melt inlet pipe 51 can be determined within a preferred range by interpolation of the above inclination angle θ1. That is, the inclination angle θ1 of the melt inlet pipe 51 is preferably set at 55° to 77.5° when the supplying amount of the additional silicon melt by the melt inlet pipe 51 is 60 to 90 kg, and the inclination angle θ1 of the melt inlet pipe 51 is preferably set at 50° to 70° when the supplying amount of the additional silicon melt by the melt inlet pipe 51 is 110 to 140 kg.

DESCRIPTION OF REFERENCE NUMERALS

1 Manufacturing apparatus for silicon single crystal
  11 First chamber
  12 Second chamber
  13 Gas intake port
  14 Gas exhaust port
  15 Through hole
  21 Quartz crucible
  22 Graphite crucible
  23 Support shaft
  24 Drive mechanism
  25 First heater
  26 Thermal insulation barrel
  27 Thermal shield member
  28 Bracket
  31 Wire
  32 Pulling mechanism
  41 Magnetic field generating device
  50 Melt supplying mechanism
  51 Melt inlet pipe
  511 Opening part of tip end
  511a Vertically lower side
  511b Vertically upper side
  512 Opening part of base end
  52 Moving mechanism for melt inlet pipe
  53 Bellows
  54 Melt generating mechanism
  541 Elevating mechanism
  542 Subchamber
  543 Container
  544 Second heater
  545 Raw material hopper
  546 Inlet port
  547 Valve
  θ1 Inclination angle of melt inlet pipe
  θ2 Opening angle of tip end of melt inlet pipe
M Silicon melt
C Silicon single crystal
S Seed crystal
B Silicon raw material chunk

What is claimed is:
1. An apparatus for manufacturing a silicon single crystal, comprising:
  a chamber;

a crucible provided in the chamber so as to be rotatable and movable upward and downward, the crucible storing a silicon melt;

a first heater for melting a silicon raw material stored in the crucible;

a pulling mechanism provided in the chamber so as to be rotatable and movable upward and downward, the pulling mechanism having a lower end to which a seed crystal is attached, the seed crystal being to be dipped in the silicon melt in the crucible and pulled upward for growing a silicon single crystal by a Czochralski method; and a melt supplying mechanism for supplying an additional silicon melt to the silicon melt in the crucible from external of the chamber, the melt supplying mechanism comprising:

a melt inlet pipe of which a tip end portion is disposed at an inclination angle of 50° to 80° with respect to a melt surface of the silicon melt; and a melt generating mechanism for supplying the additional silicon melt to an opening part of a base end of the melt inlet pipe, wherein the tip end portion of the melt inlet pipe includes a tip end provided with an opening part, the opening part of the tip end having an annular surface inclined at an angle with respect to a direction orthogonal to an axis of the melt inlet pipe, the annular surface having a vertically lower side and a vertically upper side, the vertically lower side being located nearer to the tip end in the axis direction than the vertically upper side, wherein the melt generating mechanism comprises:

a subchamber provided so as to be movable upward and downward, and to be rotatable about a vertical axis;

a container provided in the subchamber so as to be rotatable in a tilting manner;

a raw material hopper provided so as to be movable upward and downward and supplying an additional silicon raw material to the container; and a second heater for melting the additional silicon raw material put in the container, wherein the additional silicon raw material is supplied from the raw material hopper to the container and the additional silicon raw material supplied to the container is melted into the additional silicon melt by the second heater, and wherein, in a state in which the melt inlet pipe is moved to the forward position by the moving mechanism, the subchamber is rotated about the vertical axis and is connected to the base end of the melt inlet pipe, and the container is rotated in the tilting manner to supply the additional silicon melt in the container to the opening part of the base end of the melt inlet pipe.

2. The apparatus for manufacturing a silicon single crystal according to claim 1, wherein the inclination angle of the tip end portion of the melt inlet pipe is set at 60° to 75° when a supplying amount of the additional silicon melt by the melt inlet pipe is 50 kg±10 kg, the inclination angle of the tip end portion of the melt inlet pipe is set at 50° to 80° when the supplying amount of the additional silicon melt by the melt inlet pipe is 100 kg±10 kg, the inclination angle of the tip end portion of the melt inlet pipe is set at 50° to 60° when the supplying amount of the additional silicon melt by the melt inlet pipe is 150 kg±10 kg, the inclination angle of the tip end portion of the melt inlet pipe is set at 55° to 77.5° when the supplying amount of the additional silicon melt by the melt inlet pipe is 60 kg to 90 kg, and the inclination angle of the tip end portion of the melt inlet pipe is set at 50° to 70° when the supplying amount of the additional silicon melt by the melt inlet pipe is 110 kg to 140 kg.

3. The apparatus for manufacturing a silicon single crystal according to claim 2, further comprising:

a bellows having one end and other end and surrounding the melt inlet pipe, the one end being provided at a through hole formed in the chamber, the melt inlet pipe being to be inserted into the through hole, the other end being provided at the base end of the melt inlet pipe; and a moving mechanism for supporting the melt inlet pipe so that the melt inlet pipe is movable between a forward position at which the melt inlet pipe penetrates the chamber and the tip end of the melt inlet pipe is close to the melt surface in the crucible and a backward position at which the melt inlet pipe is located outside the chamber, the moving mechanism moving the melt inlet pipe between the forward position and the backward position, wherein a distance between the base end of the melt inlet pipe and the chamber in the forward position is less than the distance between the base end of the melt inlet pipe and the chamber in the backward position.

4. The apparatus for manufacturing a silicon single crystal according to claim 3, wherein, after the additional silicon melt in the container is supplied to the crucible through the melt inlet pipe, connection between the subchamber and the opening part of the base end of the melt inlet pipe is released and the melt inlet pipe is moved from the forward position to the backward position.

5. The apparatus for manufacturing a silicon single crystal according to claim 1, further comprising:

a bellows having one end and other end and surrounding the melt inlet pipe, the one end being provided at a through hole formed in the chamber, the melt inlet pipe being to be inserted into the through hole, the other end being provided at the base end of the melt inlet pipe; and a moving mechanism for supporting the melt inlet pipe so that the melt inlet pipe is movable between a forward position at which the melt inlet pipe penetrates the chamber and the tip end of the melt inlet pipe is close to the melt surface in the crucible and a backward position at which the melt inlet pipe is located outside the chamber, the moving mechanism moving the melt inlet pipe between the forward position and the backward position, wherein a distance between the base end of the melt inlet pipe and the chamber in the forward position is less than the distance between the base end of the melt inlet pipe and the chamber in the backward position.

6. The apparatus for manufacturing a silicon single crystal according to claim 5, wherein, after the additional silicon melt in the container is supplied to the crucible through the melt inlet pipe, connection between the subchamber and the opening part of the base end of the melt inlet pipe is released and the melt inlet pipe is moved from the forward position to the backward position.

7. The apparatus for manufacturing a silicon single crystal according to claim 1, wherein the melt inlet pipe comprises a straight body.

8. The apparatus for manufacturing a silicon single crystal according to claim 1, wherein:
the melt inlet pipe comprises a straight body, and
the straight body is disposed in a through hole opened at a wall of the chamber at the inclination angle of 50° to 80° with respect to the melt surface of the silicon melt.

* * * * *